(12) United States Patent
Johnson

(10) Patent No.: US 7,960,986 B2
(45) Date of Patent: Jun. 14, 2011

(54) METHODS AND APPARATUS FOR MULTI-MODAL WAFER TESTING

(75) Inventor: Morgan T. Johnson, Portland, OR (US)

(73) Assignee: Advanced Inquiry Systems, Inc., Hillsboro, OR (US)

( * ) Notice: Subject to any disclaimer, the term of this patent is extended or adjusted under 35 U.S.C. 154(b) by 0 days.

(21) Appl. No.: 12/275,226

(22) Filed: Nov. 21, 2008

(65) Prior Publication Data

US 2009/0289645 A1 Nov. 26, 2009

Related U.S. Application Data

(62) Division of application No. 11/810,237, filed on Jun. 5, 2007, now Pat. No. 7,456,643.

(60) Provisional application No. 60/811,585, filed on Jun. 6, 2006.

(51) Int. Cl.
G01R 31/02 (2006.01)
G01R 31/26 (2006.01)

(52) U.S. Cl. ...................................................... 324/754

(58) Field of Classification Search ................. None
See application file for complete search history.

(56) References Cited

U.S. PATENT DOCUMENTS

| 4,975,638 A * | 12/1990 | Evans et al. | 324/754 |
| 6,181,145 B1 * | 1/2001 | Tomita et al. | 324/754 |
| 6,297,658 B1 * | 10/2001 | Nakata et al. | 324/765 |
| 6,991,969 B2 * | 1/2006 | Johnson | 438/125 |

* cited by examiner

*Primary Examiner* — Paresh Patel
(74) *Attorney, Agent, or Firm* — Perkins Coie LLP

(57) ABSTRACT

Access to integrated circuits of a wafer for concurrently performing two or more types of testing, is provided by bringing a wafer and an edge-extended wafer translator into an attached state. The edge-extended wafer translator having wafer-side contact terminals and inquiry-side contact terminals disposed thereon, a first set of wafer-side contact terminals being electrically coupled to a first set of inquiry-side contact terminals, and a second set of wafer-side contact terminals being electrically coupled to a second set of inquiry-side contact terminals. The edge-extended wafer translator having a central portion generally coextensive with the attached wafer, and an edge-extended portion extending beyond the boundary generally defined by the outer circumferential edge of the wafer. A first set of pads of at least one integrated circuit is electrically coupled to the first set of wafer-side contact terminals, and a second set of pads of the integrated circuit is electrically coupled to the second set of wafer-side contact terminals. The edge-extended wafer translator may be shaped such that its edge-extended portion is not coplanar with the central portion thereof.

14 Claims, 4 Drawing Sheets

METHODS AND APPARATUS FOR MULTI-MODAL WAFER TESTING

CROSS-REFERENCE TO RELATED APPLICATIONS

This non-provisional application is a division of non-provisional application Ser. No. 11/810,237, filed 5 Jun. 2007, now U.S Pat. No. 7,456,643 entitled "Methods And Apparatus For Bimodal Wafer Testing" which claimed the benefit of provisional application 60/811,585, filed 6 Jun. 2006, and entitled "Methods And Apparatus For Bimodal Wafer Testing", the entirety of both are hereby incorporated by reference.

FIELD OF THE INVENTION

The present invention relates generally to semiconductor test equipment, and more particularly relates to methods and apparatus for wafer sort and wafer DFT/BIST.

BACKGROUND

Advances in semiconductor manufacturing technology have resulted in, among other things, reducing the cost of sophisticated electronics to the extent that integrated circuits have become ubiquitous in the modern environment.

As is well-known, it is common to manufacture integrated circuits, on roughly circular semiconductor substrates, or wafers. Further, it is common to form such integrated circuits so that conductive regions disposed on, or close to, the uppermost layers of the integrated circuits are available to act as terminals for connection to various electrical elements disposed in, or on, the lower layers of those integrated circuits. In testing, these conductive regions are conventionally contacted with a probe card to determine if the integrated circuits on the wafer are capable of operating according to predetermined specifications.

A typical process of wafer level testing, sometimes referred to as wafer sort, includes connecting one or more integrated circuits, or dice, with a test apparatus by means of a probe card that electrically contacts those integrated circuits on a wafer. A probe card might typically contact four die at a time as it steps across the wafer, each contact pass being known in the art as a touch-down. Thus a 300 mm wafer containing 1,200 die would receive 300 touch-downs during a wafer sort sequence. Using existing wafer sort methods and apparatus, such a sequence would typically engage the wafer for several hours.

One type of wafer-level testing is known as functional testing. Functional testing exercises an integrated circuit at its device pins and observes the performance of the integrated circuit at the devices pins. As integrated circuits have become more complex, and their logic gates have become more deeply embedded, comprehensive functional testing has consequently become more difficult because of the tremendous number of states and state transitions needed for exhaustive fault coverage. To address these testing problems, a design methodology, sometimes referred to as Design For Testability (DFT), came into wide use, and in which additional circuitry, unrelated to the specified functionality of an integrated circuit, is added thereto in a such a manner that the deeply embedded logic gates can be reached and exercised. This approach is sometimes referred to as structural testing because it focuses on determining whether the constituent parts of an integrated circuit can be properly operated rather than whether the integrated circuit as a whole, and viewed from the device pins, achieves a specified functionality. In a related approach, circuitry is added to an integrated circuit that actually exercises and records the performance of portions of the integrated circuit, rather than driving the internal circuitry entirely with stimuli provided by a signal source external to the integrated circuit. This approach is sometimes referred to as Built-In Self-Test (BIST). BIST allows the results of internal test operations to be reported to an external tester. In many instances BIST allows for the communication of the results of the internal test operations without the requirement for the use of all of the device pins of the integrated circuit.

In some circumstances it is desirable to test an integrated circuit in some combination of functional, structural, and BIST test sequences. Unfortunately, conventional testing apparatus and methods result in such separate tests being performed sequentially, and often with different physical arrangements of test apparatus.

What is needed are methods and apparatus for providing simultaneous access to the integrated circuits of a wafer for concurrently performing two or more types of testing, for example two or more of functional, structural, and BIST testing.

SUMMARY OF THE INVENTION

Briefly, methods and apparatus for providing simultaneous access to the integrated circuits of a wafer, for concurrently performing two or more types of testing, includes bringing a wafer and an edge-extended wafer translator into an attached state. The edge-extended wafer translator having wafer-side contact terminals and corresponding inquiry-side contact terminals disposed thereon, a first set of wafer-side contact terminals being electrically coupled to a first set of inquiry-side contact terminals, and a second set of wafer-side contact terminals being electrically coupled to a second set of inquiry-side contact terminals. The edge-extended wafer translator having a central portion generally coextensive with the attached wafer, and an edge-extended portion extending beyond the boundary generally defined by the outer circumferential edge of the wafer. In the attached state, a first set of pads of at least one integrated circuit on the wafer is electrically coupled to the first set of wafer-side contact terminals, and a second set of pads of the at least one integrated circuit is electrically coupled to the second set of wafer-side contact terminals.

In one aspect of the present invention, the edge-extended wafer translator is shaped such that its edge-extended portion is not coplanar with the central portion thereof.

In a further aspect of the present invention, the second set of wafer-side contact terminals is disposed on the central portion of the edge-extended wafer translator and the second set of inquiry-side contact terminals is disposed on the edge-extended portion of thereof.

DETAILED DESCRIPTION

Figure 1:
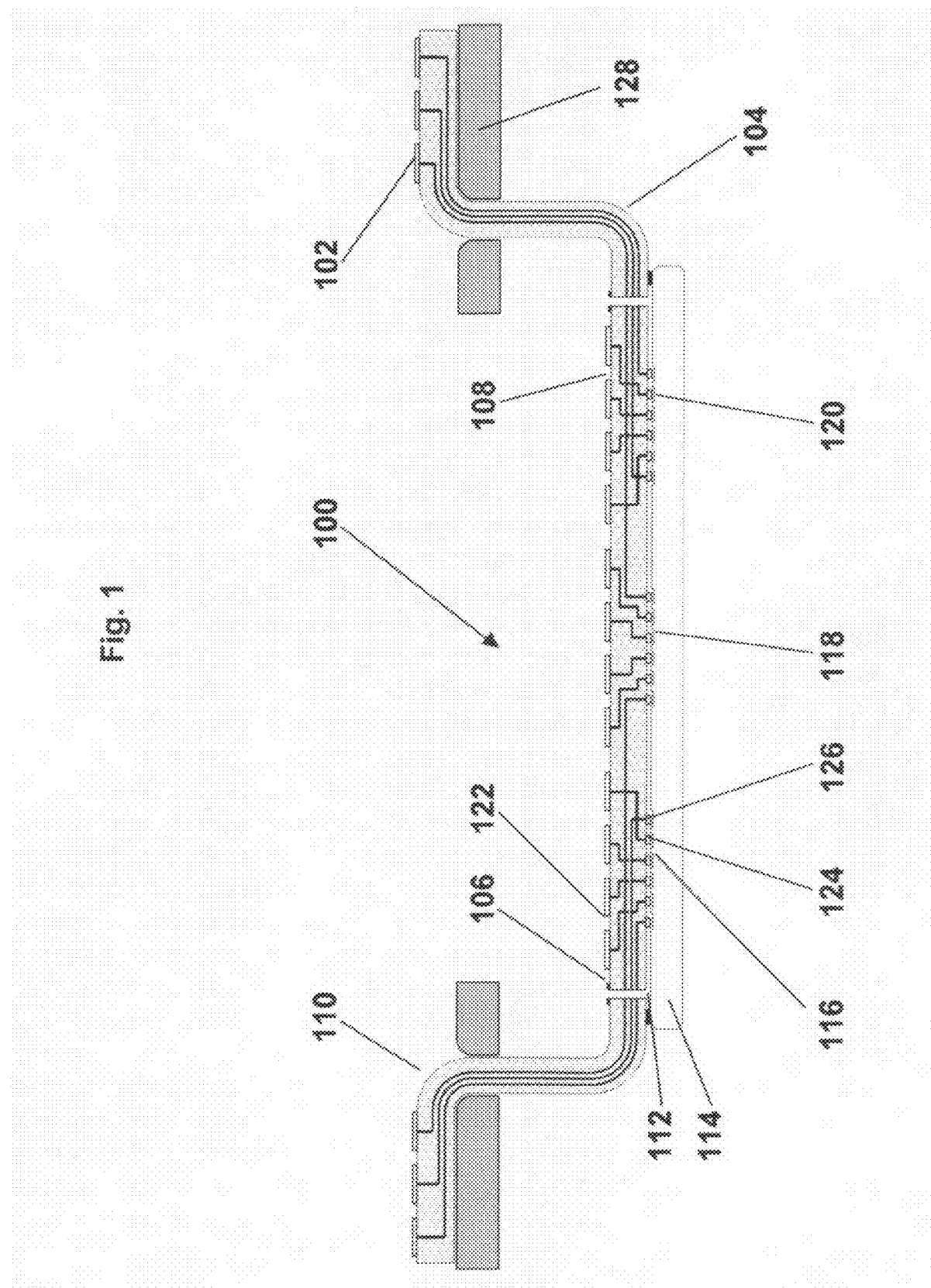
FIG. 1 is a schematic cross-sectional representation of a multi-modal wafer test assembly that includes an edge-extended wafer translator and a wafer under test.

Generally, embodiments of the present invention provide a means of conducting two or more wafer-level tests under a variety of conditions, either simultaneously, contemporaneously or asynchronously, on a wafer mounted within a single test apparatus. By providing an edge-extended wafer translator, various embodiments of the present invention allow electrical communication with integrated circuits on a wafer through a probe card/wafer prober, and at the same time through an additional set of contact terminals disposed on the wafer translator in an area outside the circumferential edge of the wafer. In various embodiments of the present invention different tests may be performed through the two sets of connections. For example, the same die may be concurrently subjected to different tests, different die may be concurrently subjected to the same test, or different die may be concurrently subjected to different tests.

In various embodiments, the edge-extended portion of the edge-extended wafer translator is spatially offset from a central portion of the edge-extended wafer translator. In typical embodiments, this spatial offset is implemented by having the edge-extended portion is disposed in a plane that is parallel to the plane in which the central portion is disposed. Although typical embodiments provide the edge-extended portion disposed in a parallel plane spaced apart from the plane of the central portion such that the edge-extended portion is above the plane of wafer to be tested in operation, alternative spatial arrangements of the edge-extended portion relative to the central portion are possible.

Reference herein to "one embodiment", "an embodiment", or similar formulations, means that a particular feature, structure, operation, or characteristic described in connection with the embodiment, is included in at least one embodiment of the present invention. Thus, the appearances of such phrases or formulations herein are not necessarily all referring to the same embodiment. Furthermore, various particular features, structures, operations, or characteristics may be combined in any suitable manner in one or more embodiments.

Terminology

Reference herein to "circuit boards", unless otherwise noted, is intended to include any type of substrate upon which circuits may be placed. For example, such substrates may be rigid or flexible, ceramic, flex, epoxy, FR4, or any other suitable material.

Pad refers to a metallized region of the surface of an integrated circuit, which is used to form a physical connection terminal for supplying power to, and communicating signals to and/or from the integrated circuit. Although pads are normally constructed from a metal or metal alloy, any suitable conductive material may be used as long as the optical reflectivity of the pad is different from the optical reflectivity of the surrounding material, typically but not exclusively the top-side passivation layer of an integrated circuit.

The expression "wafer translator" refers to an apparatus facilitating the connection of pads (sometimes referred to as terminals, I/O pads, contact pads, bond pads, bonding pads, chip pads, test pads, or similar formulations) of unsingulated integrated circuits, to other electrical components. It will be appreciated that "I/O pads" is a general term, and that the present invention is not limited with regard to whether a particular pad of an integrated circuit is part of an input, output, or input/output circuit. A wafer translator is typically disposed between a wafer and other electrical components, and/or electrical connection pathways. The wafer translator is typically removably attached to the wafer (alternatively the wafer is removably attached to the translator). The wafer translator includes a substrate having two major surfaces, each surface having terminals disposed thereon, and electrical pathways disposed through the substrate to provide for electrical continuity between at least one terminal on a first surface and at least one terminal on a second surface. The wafer-side of the wafer translator has a pattern of terminals that matches the layout of at least a portion of the pads of the integrated circuits on the wafer. The wafer translator, when disposed between a wafer and other electrical components such as an inquiry system interface, makes electrical contact with one or more pads of a plurality of integrated circuits on the wafer, providing an electrical pathway therethrough to the other electrical components. The wafer translator is a structure that is used to achieve electrical connection between one or more electrical terminals that have been fabricated at a first scale, or dimension, and a corresponding set of electrical terminals that have been fabricated at a second scale, or dimension. The wafer translator provides an electrical bridge between the smallest features in one technology (e.g., pins of a probe card) and the largest features in another technology (e.g., bonding pads of an integrated circuit). For convenience, wafer translator is referred to simply as translator where there is no ambiguity as to its intended meaning. In some embodiments a flexible wafer translator offers compliance to the surface of a wafer mounted on a rigid support, while in other embodiments, a wafer offers compliance to a rigid wafer translator. The surface of the translator that is configured to face the wafer in operation is referred to as the wafer-side of the translator. The surface of the translator that is configured to face away from the wafer is referred to as the inquiry-side of the translator. An alternative expression for inquiry-side is tester-side.

The expression "edge-extended wafer translator", as used herein, refers to an embodiment of a translator in which electrical pathways disposed in and/or on the translator lead from wafer-side contact terminals, which in use are electrically coupled to pads of integrated circuits on the wafer under test, to inquiry-side contact terminals disposed on the inquiry-side of the translator. In various embodiments of the present invention, a first set of inquiry-side contact terminals are disposed on the translator within a central portion thereof, and a second set of inquiry-side contact terminals are disposed on the translator outside of a circumferential edge of the central portion. In some embodiments, the edge-extended portion may be vertically offset from the central portion. In one such vertically offset configuration, the edge-extended portion is disposed in a plane above the inquiry-side surface of the edge-extended wafer translator, thereby creating a "well" with the central portion at the bottom and the edge-extended portion at the top.

Inquiry system interface refers to apparatus disposed between the inquiry-side of a translator and an inquiry system. Inquiry system interfaces provide at least electrical pathways coupled between the inquiry-side of a translator and an inquiry system. Inquiry system interfaces may incorporate a variety of passive and/or active electrical components, as well as a variety of mechanical devices for attaching, coupling, connecting, or communicating to the inquiry-side of a translator and/or the inquiry system (e.g., a tester). Various implementations of inquiry system interfaces may be as simple as a circuit board that passes signals from one surface to the other, or may be complex apparatus including active electronics, and mechanical devices suitable for placing, orienting and/or aligning the inquiry system interface.

The expression "translated wafer" refers to a wafer/wafer translator pair in the attached state, wherein a predetermined portion of, or all of, the contact pads of the integrated circuits on the wafer are in electrical contact with corresponding electrical connection means disposed on the wafer-side of the translator. Typically, the wafer translator is removably attached to the wafer. Removable attachment may be achieved, for example, by means of vacuum, or pressure differential, attachment.

The terms die, chip, integrated circuit, semiconductor device, and microelectronic device are sometimes used interchangeably in this field. The present invention relates to the manufacture and test of chips, integrated circuits, semiconductor devices and microelectronic devices as these terms are commonly understood in the field.

In some embodiments of the present invention, a multi-modal wafer test assembly includes a wafer and an edge-extended wafer translator in an attached state. The attached state may be achieved by creating a vacuum, or a pressure differential, between the wafer and at least a portion of the edge-extended wafer translator. It will be appreciated that such vacuum attachment typically further includes one or more mechanisms for substantially, or completely, sealing the space between the wafer and a portion of the edge-extended wafer translator. In some embodiments, a gasket, such as an O-ring, may be disposed between the wafer and the edge-extended wafer translator to effect a substantially air-tight seal. Any suitable means of providing such a seal may be used.

The multi-modal wafer test assembly is suitable for use with existing wafer probers with little or no modification to such wafer probers.

The edge-extended wafer translator may be a flexible, multi-layered printed circuit board. Disposed within the edge-extended wafer translator are multiple sets of wire paths, rendering the dice on a wafer available to multiple testing devices simultaneously.

It is noted that in some embodiments, the material composition of the edge-extended wafer translator is selected such that a close match in the thermal expansion characteristics of the wafer and of the edge-extended wafer translator is achieved. In some embodiments the edge-extended wafer translator may be reinforced for closer thermal expansion matching with the wafer under test.

FIG. 1 is a schematic cross-sectional representation of a multi-modal wafer test assembly 100 that shows an edge-extended wafer translator 110, mounting fixture 128, and wafer 114, which may be joined by means of a pliable gasket 112 and vacuum evacuation path 106 to create a vacuum seal between edge-extended wafer translator 110 and wafer 114. Alternatively, wafer 114 and edge-extended wafer translator 110 may be removably attached by any suitable means. Such suitable means create a pressure differential between the space between the wafer 114 and the central portion of wafer translator 110. Assembly 100 brings into contact a plurality of wafer-side contact terminals 124, 126, disposed on the wafer-side of edge-extended wafer translator 110, with a plurality of pads disposed on the integrated circuits of wafer 114. Wafer-side contact terminals 124, 126 are positioned to correspond to the arrangement of pads on integrated circuits, 116, 118, 120. Wire paths 104 connect a plurality of wafer-side contact terminals 124 to a corresponding number of inquiry-side contact terminals 102, disposed on the outermost regions of the uppermost surface of edge-extended wafer translator 110 i.e., the inquiry-side of the edge-extended portion. Wire paths 122 electrically connect wafer-side contact terminals 126 to a corresponding number of conductive inquiry-side contact terminals 108, disposed on the inquiry-side of edge-extended wafer translator 110. As can be seen from FIG. 1, the outer region, or edge-extended portion, of edge-extended wafer translator 110 is vertically offset from the central portion thereof, in order to create a multi-planar structure.

Figure 2:
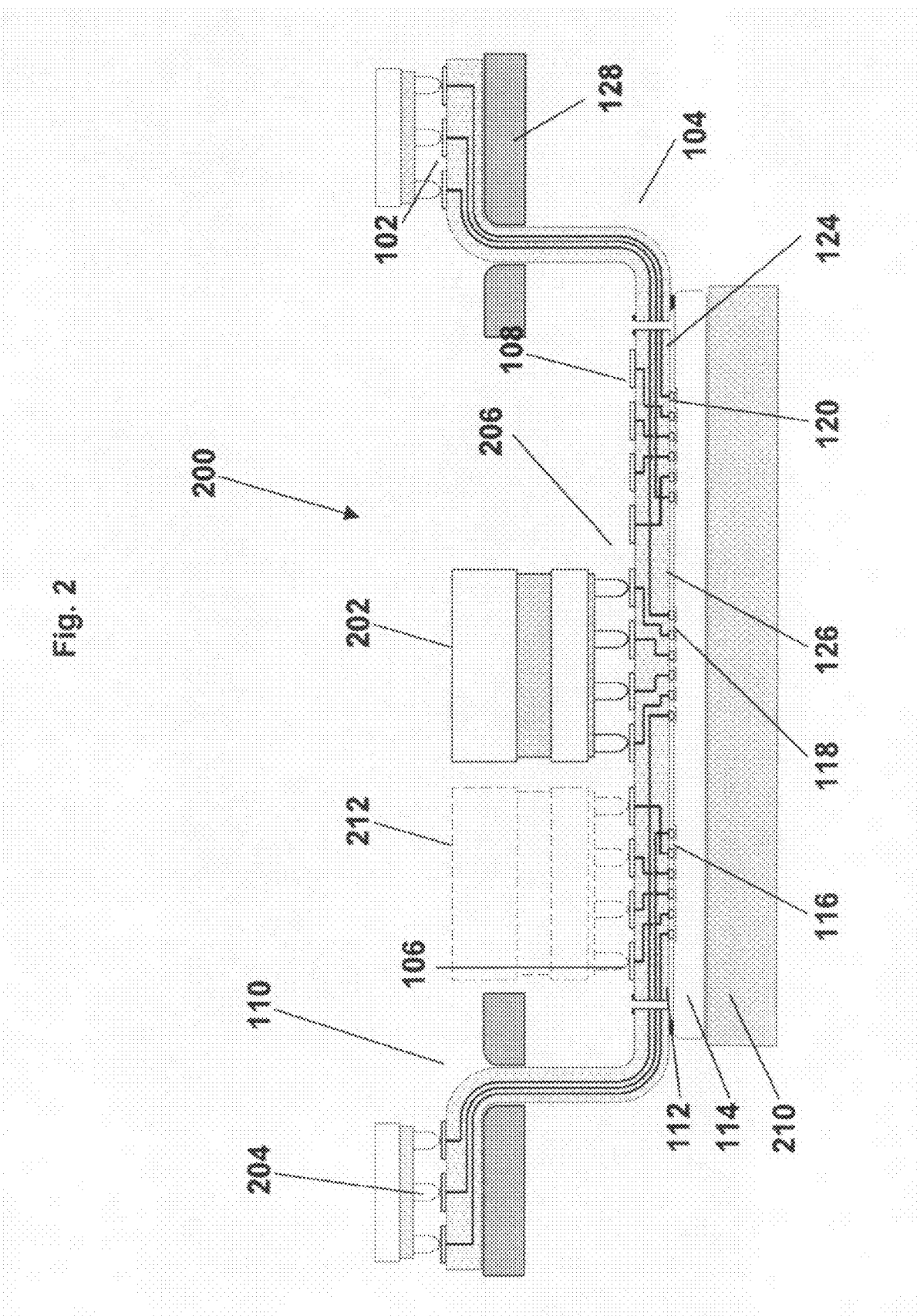
FIG. 2 is a schematic cross-sectional representation of a full wafer test assembly and multi-modal wafer test assembly in operation.

FIG. 2 is a cross-sectional view of an illustrative full wafer multi-modal test assembly 200, in operation. In this embodiment, edge-extended wafer translator 110 may be mounted in a fixture 128, and wafer 114 may be mounted on a wafer chuck 210. Probe pins 206 located on the underside of probe card 202, contact inquiry-side contact terminals 108, which are electrically connected by wire paths 122 to integrated circuit 118. Probe pins 206 may then step to a new position 212 to contact integrated circuit 116, and continue to step, contacting each die on wafer 114 successively. Pin electronics 204, referred to herein as DFT/BIST probe pins, may electrically contact inquiry-side contact terminals 102. Probe pins 206 and 204 may contact the central portion and the edge-extended portion respectively of edge-extended wafer translator 110 simultaneously, contemporaneously or asynchronously. It is noted that probe pins 206, 208, are coupled to tester channels in operation.

Figure 3:
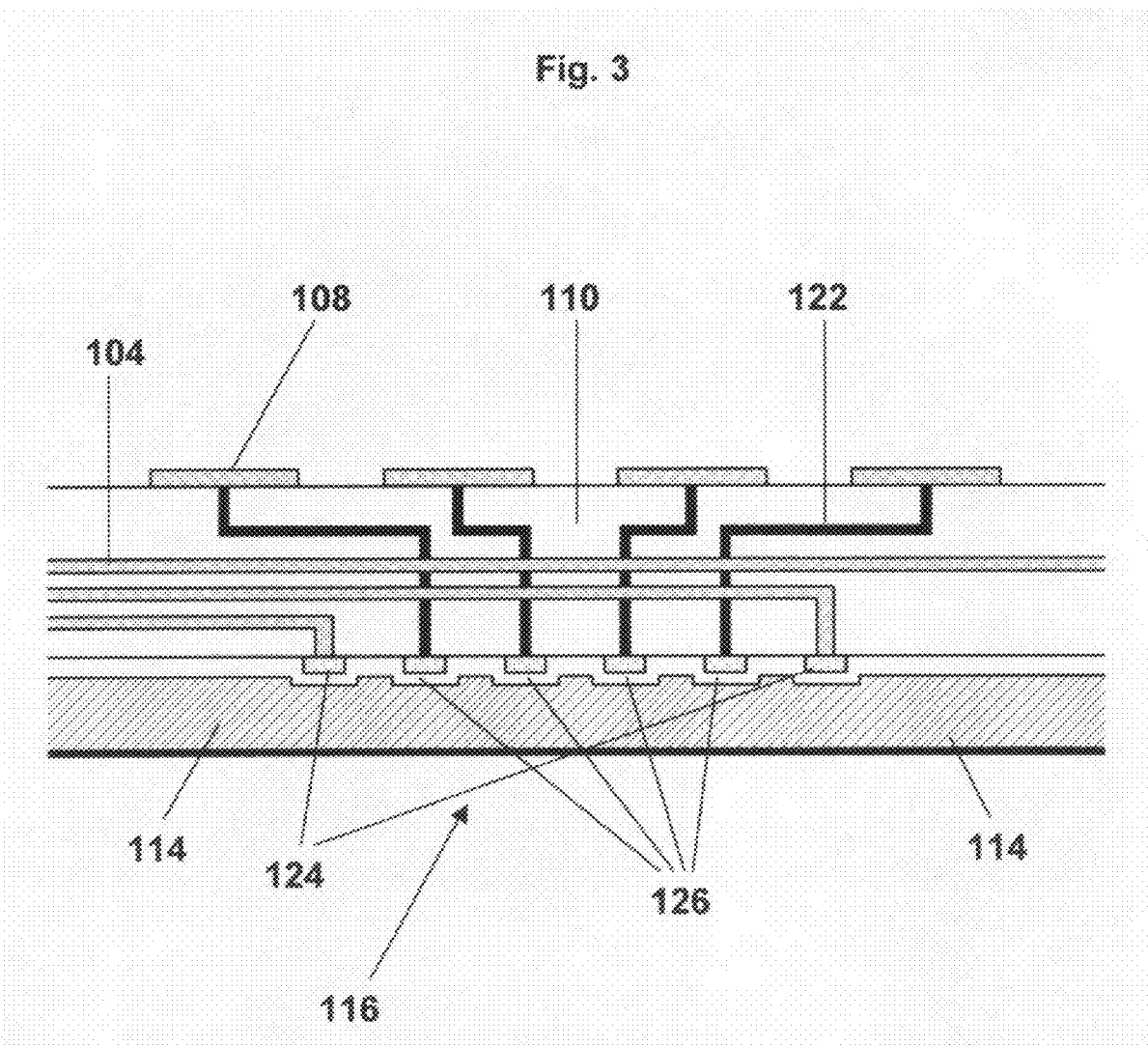
FIG. 3 is a close-up schematic cross-sectional representation of a single integrated circuit from FIG. 1.

FIG. 3 is a close-up schematic cross-sectional representation of integrated circuit 116, disposed within wafer 114, and in contact with wafer translator 110. In this illustrative embodiment, two distinct sets of wire paths 104 and 122, contact two distinct sets of electrically conductive pads 124 and 126, so that they may be contacted simultaneously, contemporaneously or asynchronously. Wire paths 104 connect to electrically conductive pads 124, and may be led off of the wafer to DFT/BIST pads located at an outermost region of edge-extended wafer translator (see FIGS. 1 and 2). Wire paths 122 connect electrically conductive pads 126 to inquiry-side contact terminals 108 disposed on the upper surface of translator 110.

Figure 4:
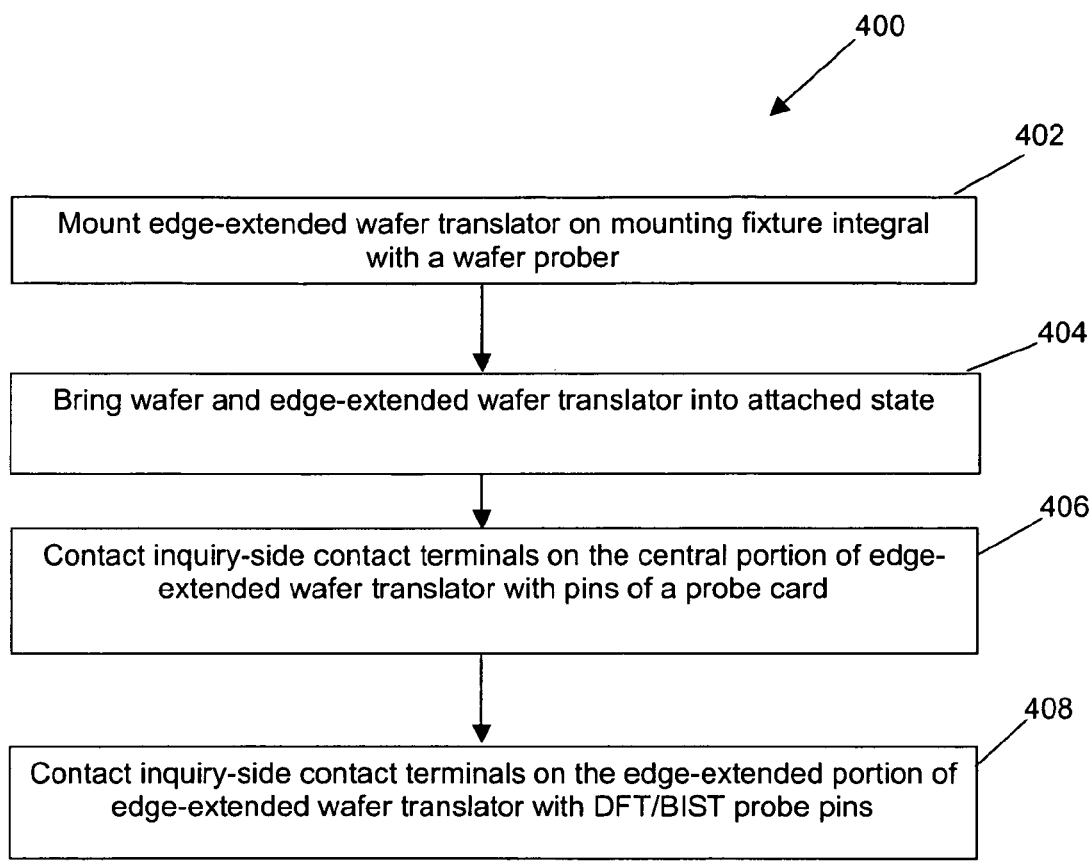
FIG. 4 is a flow diagram of an illustrative process of providing concurrent access to at least one integrated circuit on a wafer for performing two or more tests concurrently, in accordance with the present invention.

FIG. 4 is a flow chart of an illustrative process 400 in accordance with the present invention. More particularly, illustrative process 400 includes mounting 402 an edge-extended wafer translator on a mounting fixture integral with a wafer prober; and bringing 404 a wafer and the edge-extended wafer translator into an attached state. It is noted that the attached state is typically a temporary state and so the wafer and edge-extended wafer translator are removably attached. Process 400 further includes contacting 406 inquiry-side contact terminals on the central portion of the edge-extended wafer translator with pins of a probe card; and contacting 408 inquiry-side contact terminals on the edge-extended portion of the edge-extended wafer translator with DFT/BIST probe pins.

CONCLUSION

The exemplary methods and apparatus illustrated and described herein find application in the field of integrated circuit test and analysis.

It is to be understood that the present invention is not limited to the embodiments described above, but encompasses any and all embodiments within the scope of the subjoined Claims and their equivalents.

What is claimed is:

1. An assembly for providing concurrent electrical access to one or more integrated circuits on a wafer, comprising:
an edge-extended wafer translator having a central portion, and an edge-extended portion vertically offset from the central portion;
a mounting fixture upon which the vertically offset edge-extended portion is disposed;

a first probe structure operable to contact a first plurality of inquiry-side contact terminals; and a second probe structure operable to contact a second plurality of inquiry-side contact terminals:

wherein removably attaching the wafer to the central portion brings a first plurality of wafer-side contact terminals into electrical contact with a first set of pads on the wafer, and brings a second plurality of wafer-side contact terminals into electrical contact with a second set of pads on the wafer; wherein the first plurality of wafer-side contact terminals are electrically connected to the first plurality of inquiry-side contact terminals disposed on the central portion of the edge-extended wafer translator, and the second plurality of wafer-side contacts are electrically connected to the second plurality of inquiry-side contact terminals disposed on the edge-extended portion of edge-extended wafer translator; and wherein, during operation, the first probe structure is laterally movable relative to the mounting fixture and the second probe structure is fixed relative to the mounting fixture.

2. The assembly of claim 1, further comprising a wafer removably attached to the central portion of the edge-extended wafer translator.

3. The assembly of claim 2, further comprising a wafer chuck operable to position the wafer for removable attachment to the edge-extended wafer translator.

4. The assembly of claim 1, wherein the mounting fixture forms a portion of a wafer prober.

5. The assembly of claim 1, wherein the first probe structure comprises a probe card, and the second probe structure comprises DFT/BIST probe pins.

6. The assembly of claim 1, wherein the central portion of the edge-extended wafer translator is coextensive with the wafer.

7. The assembly of claim 1, further comprising at least one mechanism for substantially sealing the space between the wafer and a portion of the edge-extended wafer translator.

8. The assembly of claim 7, wherein the at least one mechanism comprises a gasket.

9. The assembly of claim 8, wherein the gasket comprises a pliable O-ring.

10. The assembly of claim 1, wherein the edge-extended wafer translator substantially matches the thermal expansion characteristics of the wafer.

11. An assembly for providing concurrent electrical access to one or more integrated circuits on a wafer, comprising:

an edge-extended wafer translator having a central portion, an edge-extended portion vertically offset from the central portion, and the edge-extended wafer translator further having a wafer-side and an inquiry-side;

a mounting fixture having an upper surface and a lower surface, the wafer-side of the vertically offset edge-extended portion of the edge-extended wafer translator disposed upon the upper surface of the mounting fixture;

a first probe structure operable to contact a first plurality of inquiry-side contact terminals; and a second probe structure operable to contact a second plurality of inquiry-side contact terminals;

wherein removably attaching the wafer to the central portion brings a first plurality of wafer-side contact terminals into electrical contact with a first set of pads on the wafer, and brings a second plurality of wafer-side contact terminals into electrical contact with a second set of pads on the wafer; wherein the first plurality of wafer-side contact terminals are electrically connected to the first plurality of inquiry-side contact terminals disposed on the central portion of the edge-extended wafer translator, and the second plurality of wafer-side contacts are electrically connected to the second plurality of inquiry-side contact terminals disposed on the edge-extended portion of edge-extended wafer translator; and wherein, the first probe structure is laterally movable relative to the mounting fixture.

12. The assembly of claim 11, wherein the first probe structure is laterally movable relative to the mounting fixture during operation.

13. The assembly of claim 12, wherein, during operation, the second probe structure is fixed relative to the mounting fixture.

14. The assembly of claim 13, further comprising a wafer removably attached to the central portion of the edge-extended wafer translator.

\* \* \* \* \*